(12) United States Patent
Zennamo, Jr. et al.

(10) Patent No.: US 6,674,342 B2
(45) Date of Patent: Jan. 6, 2004

(54) ELECTRICAL SIGNAL FILTER WITH IMPROVED ISOLATION SHIELD

(75) Inventors: Joseph A. Zennamo, Jr., Skaneateles, NY (US); Joseph N. Maguire, Syracuse, NY (US)

(73) Assignee: Eagle Comtronics, Inc., Clay, NY (US)

( * ) Notice: Subject to any disclaimer, the term of this patent is extended or adjusted under 35 U.S.C. 154(b) by 0 days.

(21) Appl. No.: 10/187,455

(22) Filed: Jul. 1, 2002

(65) Prior Publication Data

US 2002/0196102 A1 Dec. 26, 2002

Related U.S. Application Data

(63) Continuation-in-part of application No. 09/456,596, filed on Dec. 8, 1999, now Pat. No. 6,429,754.

(51) Int. Cl.[7] .................................................. H03H 7/01
(52) U.S. Cl. ....................................... 333/175; 333/185
(58) Field of Search ............................... 333/167, 168, 333/175, 185

(56) References Cited

U.S. PATENT DOCUMENTS

| | | | |
|---|---|---|---|
| 4,451,803 A | 5/1984 | Holdsworth et al. ........... 333/12 |
| 4,701,726 A | * 10/1987 | Holdsworth ................. 333/185 |
| 4,845,447 A | 7/1989 | Holdsworth ................. 333/167 |
| 5,278,525 A | 1/1994 | Palinkas ..................... 333/175 |
| 5,440,282 A | 8/1995 | Devendorf et al. ......... 333/185 |
| 6,165,019 A | 12/2000 | Kha et al. ................... 439/620 |
| 6,255,920 B1 | 7/2001 | Ohwada et al. ............. 333/206 |

* cited by examiner

*Primary Examiner*—Robert Pascal
*Assistant Examiner*—Doan Takaoka
(74) *Attorney, Agent, or Firm*—Burr & Brown (57) ABSTRACT

An electrical signal filter including elongate upper and lower filter housing members abutted along a longitudinal seam between the housing members. The housing members hold at least one circuit board. A ground post is formed integrally with the lower filter housing member and is secured to the circuit board without solder. First and second mechanical engagement members are used to rotationally secure end caps to the housing members without solder. As a result, assembly of the filter components can be accomplished without the need for expensive soldering operations, thus reducing the overall manufacturing cost of the filter.

19 Claims, 9 Drawing Sheets

ELECTRICAL SIGNAL FILTER WITH IMPROVED ISOLATION SHIELD

CROSS REFERENCE TO RELATED APPLICATION

This is a continuation-in-part of U.S. application Ser. No. 09/456,596 filed Dec. 8, 1999, now U.S. Pat. No. 6,429,754 B1, the entirety of which is incorporated herein by reference.

FIELD OF THE INVENTION

The present invention relates to an electrical signal filter with an improved isolation shield for magnetically isolating electrically interconnected filter sections from one another. The present invention also relates to an electrical signal filter whose component parts can be assembled without the use of solder.

BACKGROUND OF THE INVENTION

Figure 7:
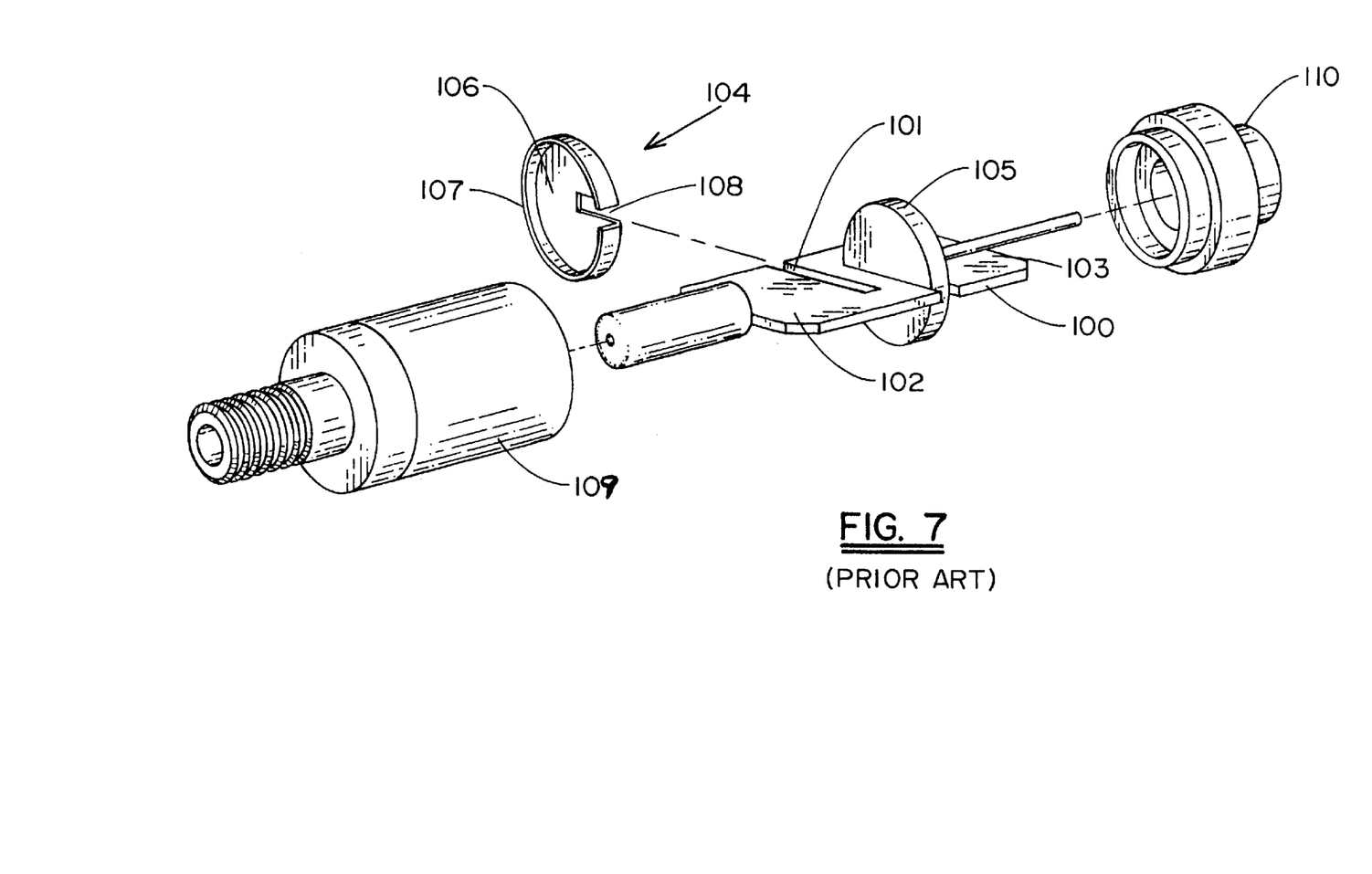
FIG. 7 is an exploded perspective view showing a filter in accordance with the prior art.

Various types of electrical signal filters are used in the CATV industry for controlling, on a frequency basis, the propagation of signals through a cable line. One example of such a filter is disclosed in U.S. Pat. No. 4,451,803, the entirety of which is incorporated herein by reference. The '803 patent discloses a split tuning filter of the type that is commonly referred to as a notch filter, for removing a selected frequency or band of frequencies from a CATV signal. With reference to FIG. 7, the split tuning filter includes a common circuit board 100 having first 102 and second 103 filter sections formed thereon by discrete electronic components such as inductors, capacitors and the like (not shown). Isolation shields 104, 105 are arranged at a midpoint along circuit board 100 to provide magnetic isolation between first filter section 102 and second filter section 103. Each shield includes a radially extending disc section 106 and a longitudinally extending flange section 107. A slot 108 is formed in each shield, to allow the remaining, unslotted portion of disc 106 to slide into a corresponding slot 101 formed in circuit board 100. One of the shields is pressed into a slot formed on one side of the circuit board, and the other shield is pressed into a slot formed on an opposed side of the circuit board, as shown in FIG. 7. As explained in the '803 patent, this arrangement prevents any "line of sight" communication between components in the first and second filter sections.

Once the shields 104, 105 are positioned on opposite sides of circuit board 100, the circuit board is inserted into housing 109, the open end of which is closed by filter cap 110. This subassembly is then inserted into a tube sleeve housing (not shown) to form the final sealed filter structure.

While the filter disclosed in the '803 patent is highly successful in providing magnetic isolation between the first 102 and second 103 filter sections, there are several drawbacks associated with the use of shields 104 and 105. First, the shields must be soldered not only to circuit board 100, but also to filter housing 109, in order to ground the circuit board. While the shields can be soldered to circuit board 100 with relative ease, it is relatively difficult to solder the shields to filter housing 109 once the shields are positioned within the confines of the housing. In order to achieve this type of soldering operation, it is necessary to apply a high heat source to the exterior of filter housing 109, which can adversely effect the characteristics of the electrical components already positioned on circuit board 100. It is also difficult to control the flow of solder within the confines of filter housing 109, and thus it is not uncommon for one or both sides of the filter to become shorted. Such shorted filters must, of course, be discarded.

Another problem relates to flange 107. The flange is present on each shield in order to guide circuit board 100 into filter housing 109 and to provide a soldering surface parallel to the wall of filter housing 109. The electronic components on the circuit board, however, must be spaced away from the shields by a distance greater than the longitudinal length of flange 107 to allow the shields to be inserted into slots 101 on opposite sides of circuit board 100. The longitudinal length of flange 107, therefore, unnecessarily increases the overall length of the filter. This problem is even more noticeable in six-pole and eight-pole filters, which use multiple shields.

Yet another problem is that the shields, being separate components, increase the total number of components that must be handled during assembly of the overall filter device. This in turn increases manufacturing time and expense.

Yet another problem with the prior art filter shown in FIG. 7 is that the end cap 110 must be soldered to the filter housing 109 in order to prevent rotation of the end cap 110 independent of the filter housing 109. Since the filter is rotatably installed as a unit, it is unacceptable if one part of the filter is able to rotate independent of other parts of the filter. This necessary soldering step adds expense to the overall filter assembly. Although electronic components of the circuit board 100 are soldered in place, that soldering step can be performed in a very efficient, mass-production scale prior to assembly of the filter components into the final filter product.

In order to ensure a good ground contact between the circuit board 100, the shields 104 and 105, and the housing 109, it is also necessary to solder the shields to the board and to the housing during assembly of the filter. This soldering step also adds expense to filter assembly, and can be quite difficult, since the shields are positioned inside the filter housing 109 during the soldering operation.

It would be desirable to provide an electrical signal filter having isolation shields that are easy to handle and solder within the filter housing. It would be more desirable to provide an electrical signal filter whose component parts can be assembled into the final filter product without any soldering steps.

SUMMARY OF THE INVENTION

It is an object of the present invention to provide an electrical signal filter that can overcome all the drawbacks associated with the prior art filters discussed above. In accordance with one object of the present invention, an electrical signal filter is provided that includes an elongate lower filter housing member extending along a first longitudinal direction from a first end thereof to an opposed second end thereof, and having an inner surface terminating at first and second upper side surfaces that extend from the first end to the second end. The filter also includes an elongate upper filter housing member extending along the first longitudinal direction from a first end thereof to an opposed second end thereof, and having an inner surface terminating at first and second lower side surfaces that extend from the first end to the second end. The elongate upper filter housing member abuts the elongate lower filter housing member at the first and second lower and upper side surfaces, respectively, along a longitudinal junction. An isolation shield is formed integrally with at least the elongate lower filter housing member and extends inwardly and upwardly from the inner surface thereof in a direction substantially perpendicular to the first longitudinal direction to thereby define first and second internal filter cavities separated by the isolation shield. A first filter section is arranged in the first internal filter cavity and a second filter section, electrically connected to the first filter section, is arranged in the second internal filter cavity. The isolation shield provides magnetic isolation between the first and second filter sections.

In accordance with a preferred embodiment, the isolation shield extends inwardly and upwardly from the inner surface of the elongate lower filter housing member to a position proximate a plane intersecting the first and second upper side surfaces thereof, and a second isolation shield is formed integrally with the elongate upper filter housing member and extends inwardly and downwardly from the inner surface thereof in axial alignment with the isolation shield of the elongate lower filter housing member.

More preferably, the upper surface of the isolation shield of the elongate lower filter housing member has a shape that is complementary to a shape of the lower surface of the second isolation shield of the elongate upper filter housing member, and those surfaces mate with each other to form the appearance of an integral shield.

In accordance with another embodiment of the invention, an electrical signal filter is provided that includes an elongate lower filter housing member extending along a first longitudinal direction from a first end thereof to an opposed second end thereof, and having an inner surface terminating at first and second upper side surfaces that extend from the first end to the second end, and an elongate upper filter housing member extending along the first longitudinal direction from a first end thereof to an opposed second end thereof, and having an inner surface terminating at first and second lower side surfaces that extend from the first end to the second end. The elongate upper filter housing member abuts the elongate lower filter housing member at a junction between the first and second lower side surfaces and the first and second upper side surfaces, respectively, to thereby define an internal filter cavity. A ground post is formed integrally with the lower filter housing member and extends upwardly from the inner surface thereof in a direction substantially perpendicular to the first longitudinal direction. A circuit board is positioned within the filter cavity and has a ground terminal fastened to the ground post without the use of solder. First mechanical engagement members extend circumferentially around portions of the outer surface of each of the upper and lower filter housing members proximate the first and second ends thereof. End caps are positioned on the first and second ends of the abutted upper and lower filter housing members, and each of the end caps has a second mechanical engagement member formed on an inner surface thereof that is complementary to and mates with the first mechanical engagement members formed on the upper and lower filter housing members.

The structure of this embodiment allows for the omission of any soldering steps during assembly of the component parts of the filter, because a mechanical engagement is provided between the ground post of the lower filter housing member and the circuit board, and mechanical engagement members are also used for preventing rotation of the end caps to the abutted filter housing members. As a result, the overall cost of manufacturing the filter can be reduced.

BRIEF DESCRIPTION OF THE DRAWINGS

For a fuller understanding of the nature and objects of the invention, reference should be made to the following detailed description of a preferred mode of practicing the invention, read in connection with the accompanying drawings, in which.

DETAILED DESCRIPTION OF THE INVENTION

Figure 1:
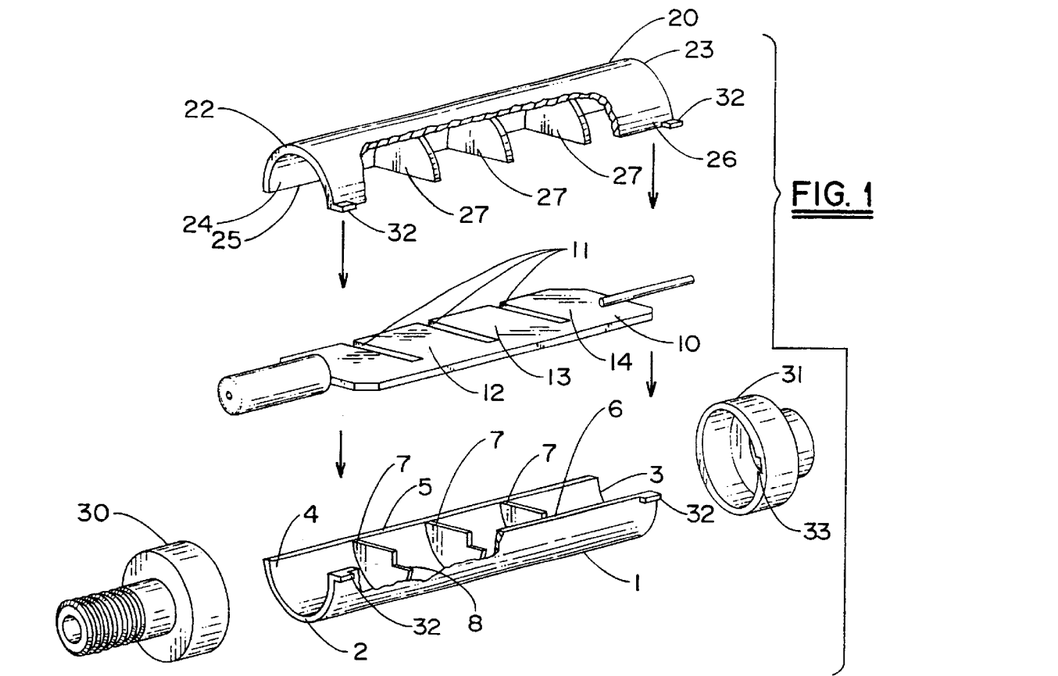
FIG. 1 is an exploded perspective view showing a filter in accordance with one embodiment of the present invention.

FIG. 1 is an exploded perspective view of an electrical signal filter in accordance with one embodiment of the present invention. The filter includes a lower filter housing member 1 that generally takes the shape of one-half of a hollow cylinder; it could, however, take any shape that would allow the objectives of the invention to be realized. The lower filter housing member has a first end 2 and an opposed second end 3, and an inner surface 4 that extends from the first end 2 to the second end 3. Inner surface 4 terminates at first 5 and second 6 longitudinal side surfaces that also extend from first end 2 to second end 3 of lower housing member 1. Lower shield members 7 are formed integrally with lower housing member 1 and extend radially inwardly from inner surface 4 in a direction substantially perpendicular to the longitudinal axis of housing member 1. Each lower shield member 7 includes a recessed portion 8 that allows circuit board 10 to rest below the upper surface of shield member 7. Circuit board 10 includes slots 11 that allow the non-recessed portions of each lower shield member 7 to pass through circuit board 10.

Circuit board 10 includes a first filter section 12, a second filter section 13, and a third filter section 14, all electrically interconnected by conductor lines (not shown) formed on circuit board 10 around slots 11. The electronic components in each filter section have been omitted in the drawings. Exemplary components that could be used are disclosed in detail in U.S. Pat. No. 5,770,983, the entirety of which is incorporated herein by reference. Such a three-section filter could be used as a six-pole tier trap, for example. In such a filter, the filter sections 12, 13 and 14 need to be magnetically isolated from one another. The lower shield members 7 provide the necessary magnetic isolation between filter sections 12, 13 and 14 both within the body of circuit board 10 and in the lower section of housing member 1 beneath circuit board 10.

Upper filter housing member 20 has basically the same construction as lower filter housing member 1, in that it includes opposed first 22 and second 23 ends, and an inner surface 24 that terminates along longitudinal side surfaces 25 and 26. The upper shield members 27, however, take the shape of substantially semicircular discs with no recessed portions. The upper shield members 27 are aligned axially, along the longitudinal axis of the filter, with lower shield members 7 so that, when the upper and lower housing members about one another to form a cylindrical filter housing, the upper and lower shield members align to form metal disc shields that isolate the various filter sections on circuit board 10 from one another.

Once circuit board 10 is positioned within lower filter housing member 1, upper filter housing member 20 is abutted thereto along the respective longitudinal side surfaces of each housing member. It is preferred that the abutted longitudinal side surfaces 5, 6 and 25, 26, respectively, have complementary shapes, such as rabbet or chevron joints, to allow the housing members to abut in a mating fashion. Such mated abutment reduces RFI/EMI leakage outside the housing, and also inhibits the flow of potting foam outside the housing. It is possible, however, to form the longitudinal side surfaces as butt joints, and then solder the housing members along the junction of the respective longitudinal side surfaces.

FIG. 1 shows that the filter also includes connector end caps 30, 31 that close the first and second ends of the filter housings and provide connection points for external components. It is preferred that the end caps are press-fit over the ends of the abutted filter housing members. In this regard, the opposite ends of the filter housing could be of reduced diameter, such that the end caps, once in place, have an outside diameter the same as or only slightly larger than the outside diameter of the main central portion of the filter housing. If necessary, to provide additional sealing and/or mechanical integrity, the end caps can be soldered in place.

FIG. 1 also shows that the upper and lower filter housing members include boss members 32, that align when the housing members are abutted, to be received within complementary grooves 33 in end caps 30, 31. This arrangement prevents rotation of the end caps relative to the housing. This is important since the filter device is often rotated as a whole when installed and the device could be damaged if the end caps were allowed to rotate independent of the filter housing.

Figure 2:
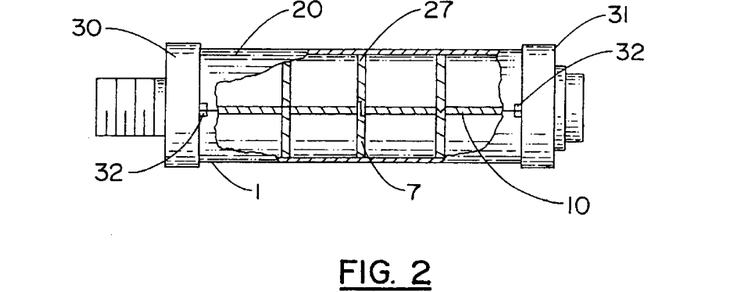
FIG. 2 is a partial sectional view of the filter of FIG. 1, showing various abutting surfaces for the upper and lower shield members.

In accordance with a preferred embodiment of the present invention, the upper surface of lower shield members 7 and the lower surface of upper shield members 27 have complementary shapes, such as shown in FIG. 2, to allow the lower and upper shield members to mate with one another and form a more effective isolation shield. The left-hand shield in FIG. 2 shows the lower 7 and upper 27 shield members taking the shape of a simple butt joint, while the middle and right-hand shields show rabbet and chevron joints, respectively.

While any method could be used to form the filter housing members, it is preferred that the lower and upper housing members are cast or pressed to include the respective shield members as integral parts. This solves one of the problems associated with the prior art, in that the isolation shields and filter housing members can be handled as single units.

The filter shown in FIG. 1 also avoids the need to solder the isolation shields to the inner surface of the filter housing, as those shields are formed as integral extensions of the filter housing members. Moreover, since the filter housing members are split longitudinally, and the circuit board 10 is placed along the Z-axis direction into lower filter housing member 1, it is easier to solder circuit board 10 to each lower shield member 7 to establish a good ground contact (i.e., the solder joints are exposed). Moreover, the fact that the circuit board and upper housing member are assembled in the Z-axis direction facilitates mass production.

The materials used for the upper and lower filter housing members and the upper and lower shield members can be any of the materials conventionally used, such as die cast zinc alloy #3 or #5. If it is necessary to use a less electrically conductive material to form the integral housing and shield members, it is possible to coat the inner surfaces of the housing and shield members with an electrically conductive coating to provide sufficient electrical performance with respect to the necessary ground connections.

The integral construction of the housing and shield members also allows for a reduction in length of the overall filter device. It can be seen from the drawings that the shield members 7 and 27 do not have longitudinally extending flange members, as in the prior art. As a result, it is no longer necessary to space electrical components away from the shield members to allow room for the shield members to be inserted into the circuit board, as in the prior art. It is expected that at least 1/10 of an inch will be saved for every shield employed. This size reduction is significant in an industry such as the CATV industry, where component space is limited. The size reduction also reduces material cost.

Figures 3, 4, 5:
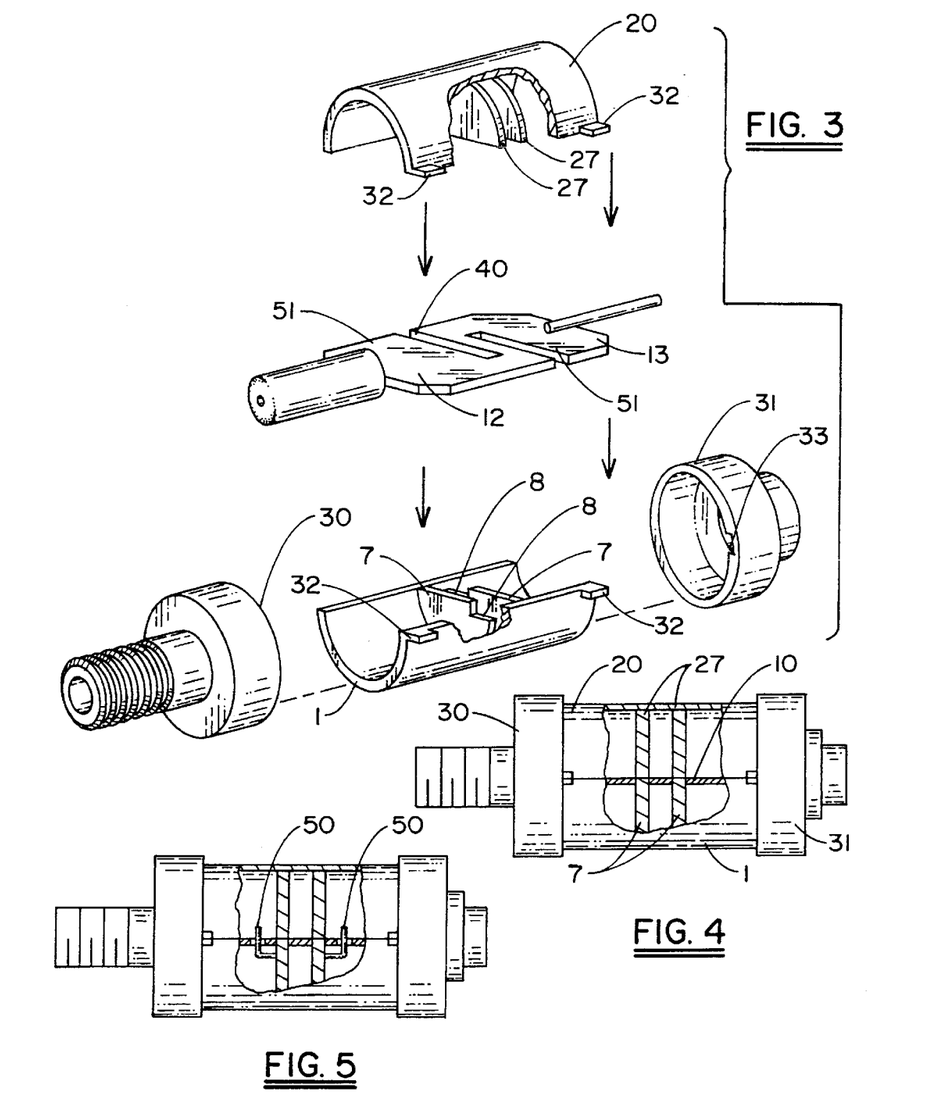
FIG. 3 is an exploded perspective view showing a filter in accordance with another embodiment of the present invention.
FIG. 4 is a partial sectional view of the filter of FIG. 3.
FIG. 5 is a partial sectional view of an alternative embodiment of the filter shown in FIG. 4.

FIGS. 3 and 4 show a filter having only two filter sections 12, 13 that need to be magnetically isolated from one another, such as a four-pole split tuning filter (see, for example, U.S. Pat. Nos. 4,451,803 and 5,770,983). It is known in the art that in this type of filter the four poles are tuned to the same frequency. As explained in the '803 patent, it is imperative to provide adequate magnetic isolation between the first and second filter sections to avoid detuning one filter section when tuning the other filter section. As such, it is preferable to use two lower shield members 7 having recesses 8 arranged on opposite sides of the filter housing. As shown in FIG. 3, circuit board 10 has a serpentine conductor section 40 that provides electrical communication between the first 12 and second filter 13 sections. The upper shield members 27, as shown in FIG. 3, are configured the same as upper shield members 27 in FIG. 1. When the upper 20 and lower 1 filter housing members are assembled together (in the manner explained above), FIG. 4 shows that the lower 7 and upper 27 shield members abut to form mated disc shields (other abutting surfaces, as shown in FIG. 2, could also be used). As the recesses 8 in the shields are offset, the disc shields prevent any "line of sight" communication between the components of the first 12 and second filter 13 sections. This configuration provides sufficient magnetic isolation between the two filter sections in a four-pole notch filter type application.

In accordance with the present invention, when circuit board 10 is positioned in lower filter housing member 1, it is relatively easy to solder the ground termination between lower shield members 7 and the ground conductors on the circuit board. There is a possibility, however, that a space may exist between slots 11 in circuit board 10 and lower shield members 7. Solder may flow through this space below circuit board 10 in an uncontrolled manner. In an attempt to alleviate this potential problem, FIG. 5 shows an alternative embodiment of the filter device shown in FIG. 4, wherein ground posts 50 extend outwardly and upwardly from lower shield member 7 through a corresponding hole 51 in each filter section of circuit board 10. The ground posts could be soldered to the shields or formed integrally therewith when forming the shields. In the latter case, the ground posts should extend along the same axis as that of the casting operation used to form the shields (e.g., along the Z-axis direction).

When the ground posts extend upward through the circuit board, the upper portions thereof can be solder-terminated to the circuit board. Alternatively, the ground posts can be formed with a pedestal portion arranged below the circuit board and the upper portions thereof can be peened over to form a gas-free compression joint between a ground termination formed on the lower surface of the circuit board and an upper surface of the pedestal-shaped portion of the ground posts. Another option would be to terminate each ground post at the level of the pedestal portion and then insert a fastener (e.g., a screw) through the circuit board to form a gas-free compression joint between the ground termination formed on the lower surface of the circuit board and the pedestal portion of the ground post.

All of the above-described options are effective to prevent the problem of uncontrolled solder flow below the circuit board. That is, even if the ground posts are soldered to the circuit board, the soldering operation is performed at a position on circuit board 10 away from any space that might exist between slots 11 and lower shield members 7.

Figure 6:
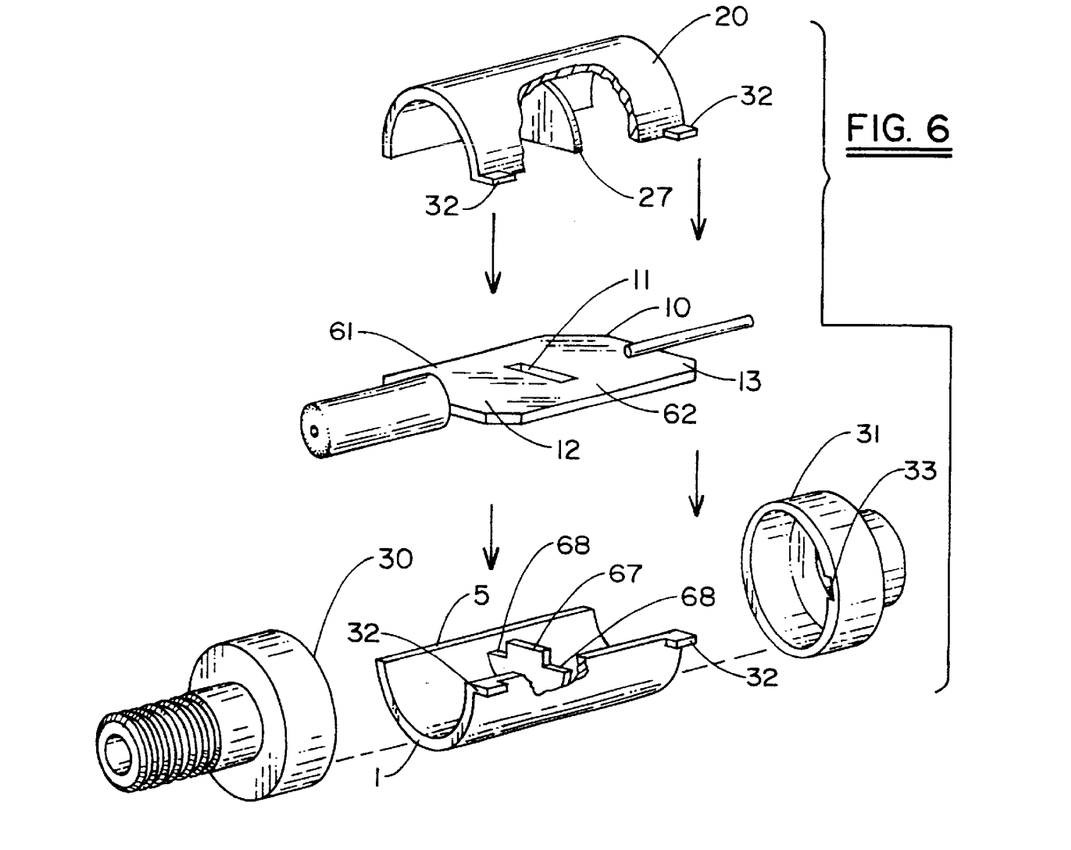
FIG. 6 is an exploded perspective view showing a filter in accordance with yet another embodiment of the present invention.

FIG. 6 shows yet another embodiment of a filter in accordance with the present invention. The filter includes the same components as in FIG. 3, except the two, recess-opposed lower shield members 7 are replaced with a single lower shield member 67 having recesses 68 on opposite sides thereof adjacent each longitudinal side surface 5, 6. The recesses 68 can be made sufficiently small to minimize any "line of sight" between components on the first 12 and second 13 filter sections.

FIG. 6 shows that slot 11 is formed in the interior of circuit board 10, thus leaving contiguous side portions 61, 62 on circuit board 10. A circuit board of this construction is more mechanically sound compared to the circuit board shown in FIG. 3. The conductor line connecting first 12 and second 13 filter sections can be formed on either side portion 61, 62.

Although not shown in the drawings, the slot 11 in circuit board 10 shown in FIG. 6 could be replaced with two slots on opposite sides of the circuit board, and a single recess 68 could be formed in a central region of lower shield member 67.

Figure 8:
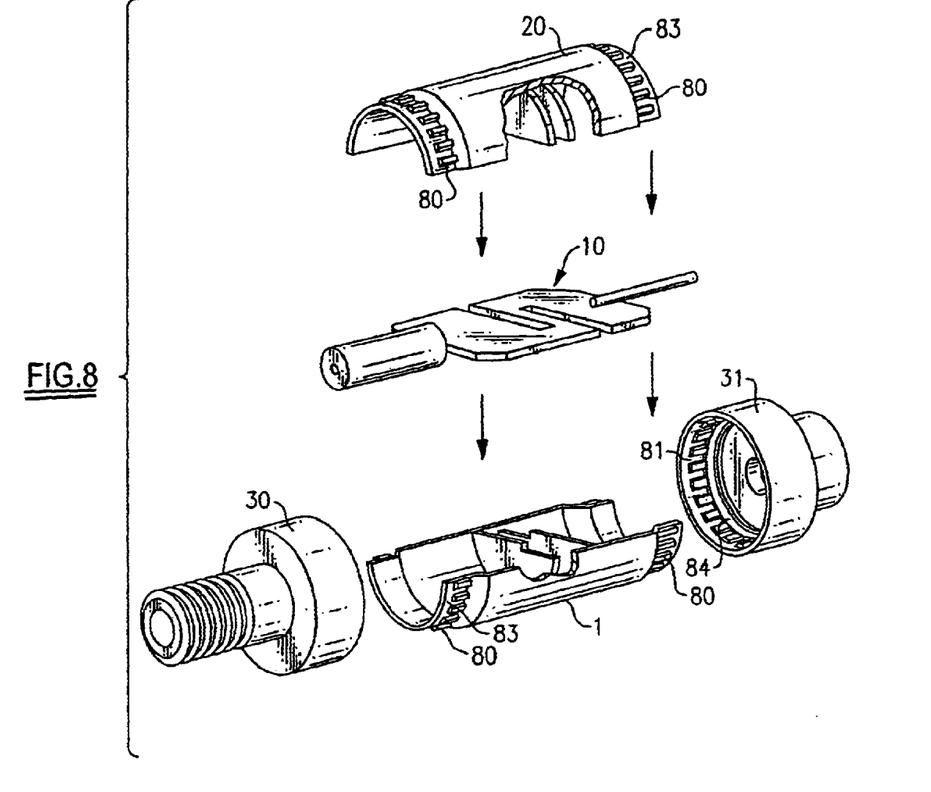
FIG. 8 is an exploded perspective view showing a filter in accordance with yet another embodiment of the present invention.
Figure 9:
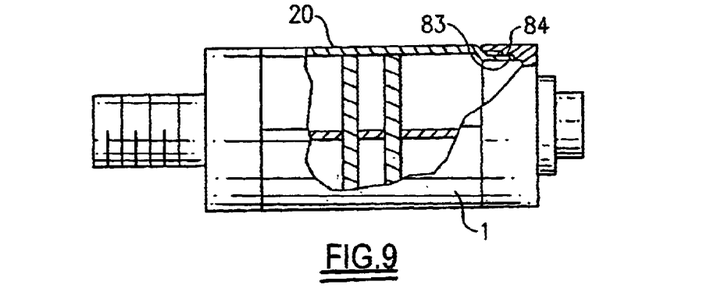
FIG. 9 is a partial sectional view of the filter of FIG. 8.

FIGS. 8 and 9 show a filter in accordance with another embodiment of the present invention. Like reference numerals from the earlier drawings have been used herein to designate like structure.

In the embodiment shown in FIG. 8, the boss members 32 and complementary grooves 33 have been removed from the lower 1 and upper 20 filter housing members, and from the end caps 30 and 31. A first mechanical engagement member, such as ribs 80, is formed on the outer surface of the lower 1 and upper 20 filter housing members, and mates with a complementary, second mechanical engagement member, such as grooves 81, formed on the inner surface of end caps 30 and 31 (not shown on end cap 30 in FIG. 8). As seen more clearly in the cross-sectional view of FIG. 9, the ribs 80 are spaced from the ends of the filter housing members such that a terminal portion 83 of the filter housing members can be press fit in a corresponding annular shoulder 84 formed in each end cap 30 and 31. The mechanical engagement members prevent rotation of the end caps 30 and 31 independent from the filter housing members 1 and 20. The press-fit between portion 83 and shoulder 84 maintains the component parts together until the parts can be sealed within an outer protective sleeve, as discussed below. If the housing members do not contain any access holes therein (to tune electronic components on the circuit board, for example), the press-fit between portion 83 and shoulder 84 can provide a gas-tight seal at this interface. If necessary, an additional sealant material, such as Loc-tite™ can be used at this interface, as well. Importantly, however, this design prevents the need for solder at this interface (to prevent rotation of the component parts), and thus eliminates an expensive step in the filter assembly process.

Figure 10:
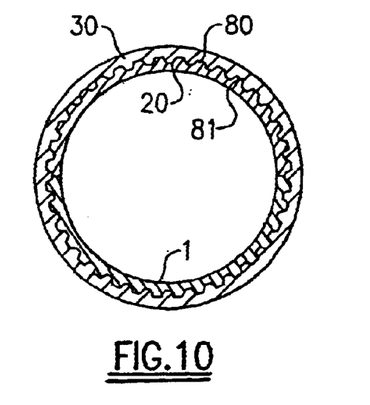
FIG. 10 is a radial cross-sectional view showing the interface between end caps 30 and 31 and the outer surface of upper 20 and lower 1 filter housing members.

FIG. 10 is a partial cross-sectional view showing the engagement between the ribs 80 formed on the outer surfaces of the lower 1 and upper 20 filter housing members, and the grooves formed on the inner surface of the end caps 30 and 31. Again, this engagement prevents rotation of the end caps independent of the filter housing members, which is important for the reasons explained earlier herein.

Figure 11A:
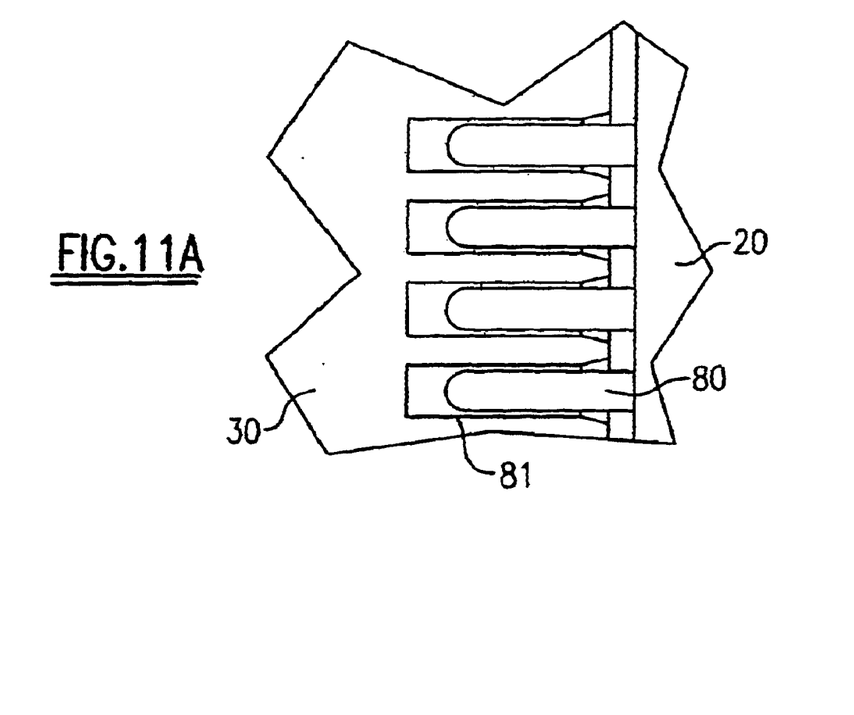
FIGS. 11A and 11B are partial plan and partial cross-sectional views showing the protruded ribs formed on the filter housing members and the grooves formed in the end caps.
Figure 11B:
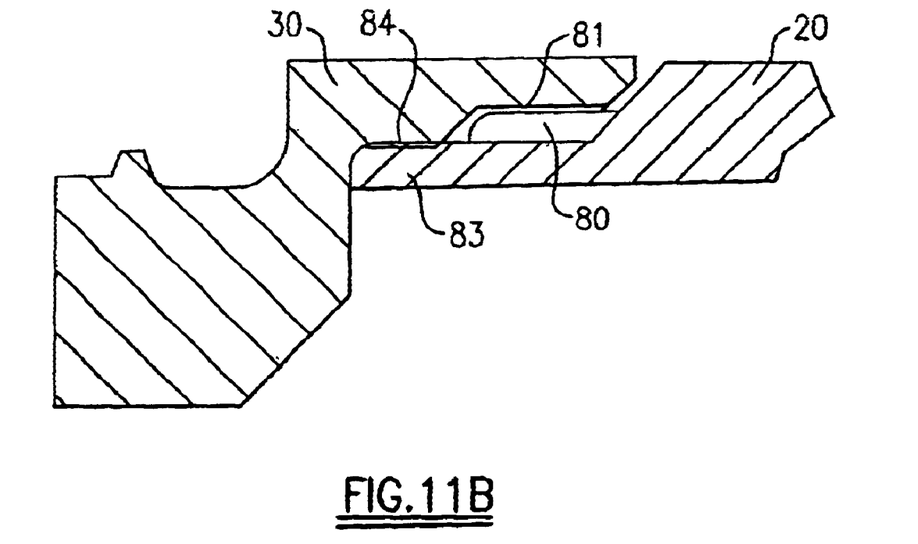

FIGS. 11A and 11B show that there is a clearance between the entirety of each rib 80 and its corresponding groove 81. This insures that the ribs and grooves will mate freely.

FIG. 11A also show that the entry region 82 of each groove 81 is outwardly chamfered. This insures that the ribs 80 will self-align with the grooves 81 when the end caps 30 and 31 are assembled on the ends of the abutted filter housing members 1 and 20.

In addition to the above, since ribs 80 extend around the entire periphery of the filter housing members 1 and 20, and since grooves 81 extend around the entire inner surface of end caps 30 and 31, these parts assemble together without the need for any significant rotational alignment. This, in turn, facilitates automated machine assembly for these parts.

Figure 13:
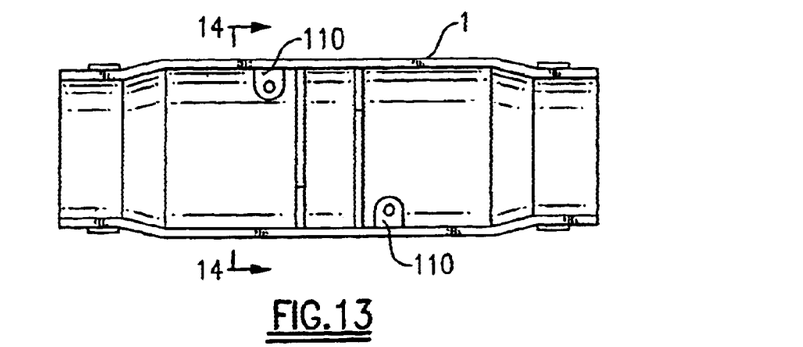
FIG. 13 is a top view of the lower filter housing member 1 shown in FIG. 12.
Figure 14:
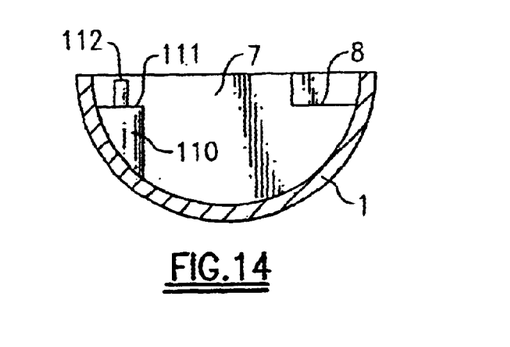
FIG. 14 is an end view of the lower filter housing member 1 shown in FIG. 12.

By using the structure shown in FIGS. 8–11, all of the soldering steps required to assemble the components of the final filter structure can be eliminated, except for the step of soldering the ground plane of the circuit board 10 to the filter housing and shields. This soldering step can also be eliminated, however, by adopting the embodiment shown in FIGS. 12–14. These drawings show that ground posts 110 can be integrally cast with the lower filter housing member 1. Each ground post 110 includes an upper shoulder 111 that is positioned at the same height as the recesses 8 in the lower shield members 7. Extending from the shoulder portion 111 is a ground pin 112. The entirety of the ground post, including the ground pin 112, is arranged along the Z-axis of the lower filter housing member 1.

Figure 12:
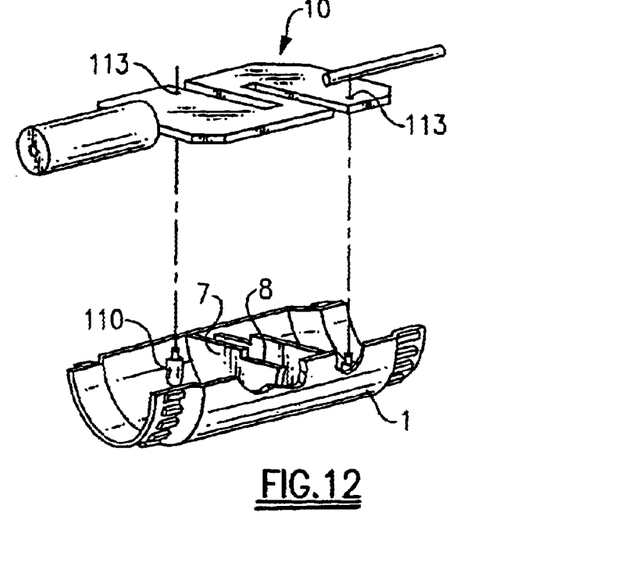
FIG. 12 is an exploded perspective view showing a filter in accordance with yet another embodiment of the present invention.

FIG. 12 shows that the circuit board is placed within the lower filter housing member 1 in the Z-axis manufacturing direction such that the ground pins 112 pass through corresponding ground holes 113 formed through circuit board 10. The height of the ground pin 112 is such that it will extend above the upper surface of the circuit board 10 when the circuit board is positioned within the lower filter housing member 1 and rests upon the bottom of the recesses 8 formed in each shield member 7.

Figure 15A:
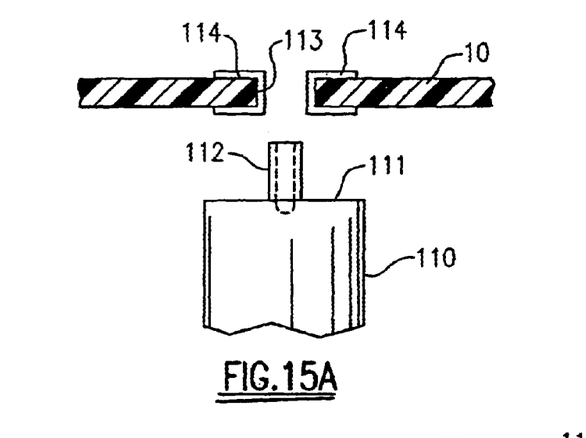
FIGS. 15A–15C show the progression of attaching the circuit board 10 to the ground post 110.
Figure 15B:
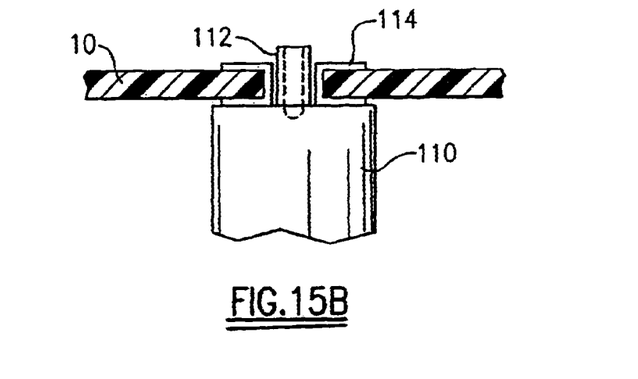
Figure 15C:
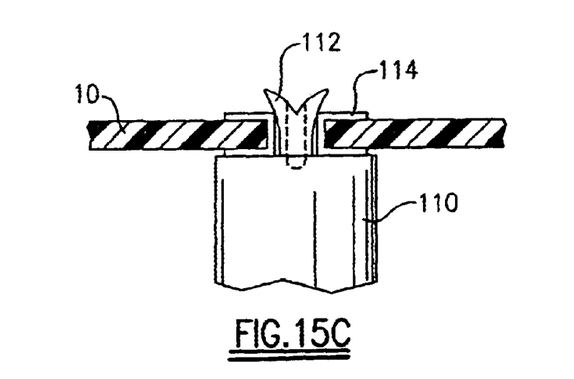

FIGS. 15A–15C show that the ground holes 113 formed through circuit board 10 preferably are plated with a metal such as copper, such that the plating 114 extends from the upper surface to the lower surface of circuit board 10 through the holes 113. FIGS. 15A–15C show that, once the circuit board is positioned on the ground post 110 in contact with the shoulder portion 111, the tip portion of ground pin 112 can be peened over to form mechanical and electrical contact (preferably a gas-free compression joint) between the ground post and the plated through-hole 113 in the circuit board 10. That is, the bottom of plating 114 is in intimate contact with shoulder portion 111 and the top of plating 114 is in intimate contact with portions of the peened ground pin 112.

Use of the filter shown in FIG. 12 eliminates all soldering steps necessary to assemble the component parts of the filter. Again, while the circuit board will have been wave-soldered to secure the electronic components thereto, no soldering steps are necessary in the actual assembly of the filter components adopting the structure shown in FIG. 12.

Figure 16A:
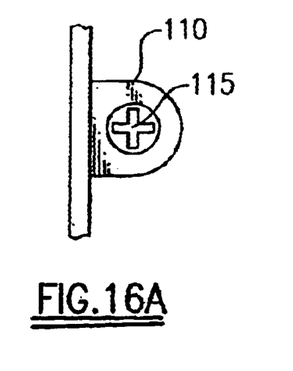
FIGS. 16A–16E are top views showing alternative forms for the pin of the ground post 110.

FIG. 16A is a top view of the ground post 110 showing a cross-shaped recess 115 extending into ground pin 112. This recess will assist in mechanical deformation of the tip portion of the ground pin 112 by allowing the ground pin to break at the cross tip portions, so that roughly quarter segments of the ground pin will be pressed outwardly and downwardly against the top of plating 114 during the peening operation.

Figure 16B:
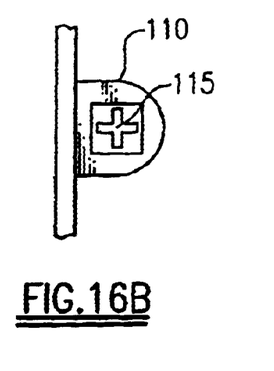

FIG. 16B shows another shape for the ground pin 112, which has a square cross-sectional shape and includes a cross-shaped hole therein. In this case, the tips of the cross are positioned adjacent the sides of the square so that the four corners of the ground pin 112 will separate and spread radially during the peening operation.

Figure 16C:
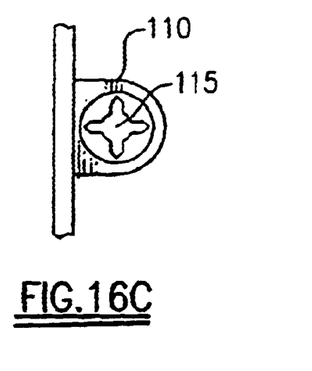
Figure 16D:
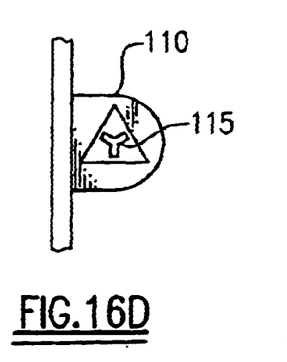
Figure 16E:
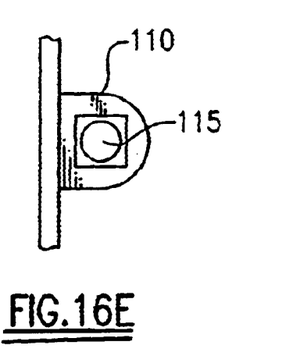

FIGS. 16C–16E show other configurations for the ground pin 112 and the recess 115 formed therein. Any shaped recess 115 can be used so long as it assists in mechanical deformation of ground pin 112, or the hole could be eliminated altogether if the ground pin 112 is malleable enough to form a good mechanical and electrical contact with plating 114 after peening. While the depth of recess 115 is not necessarily critical, the recess should extend at least below the upper surface of circuit board 10 to insure that the peened tip portion of ground pin 112 makes good mechanical and electrical contact with the top of plating 114.

Figure 17:
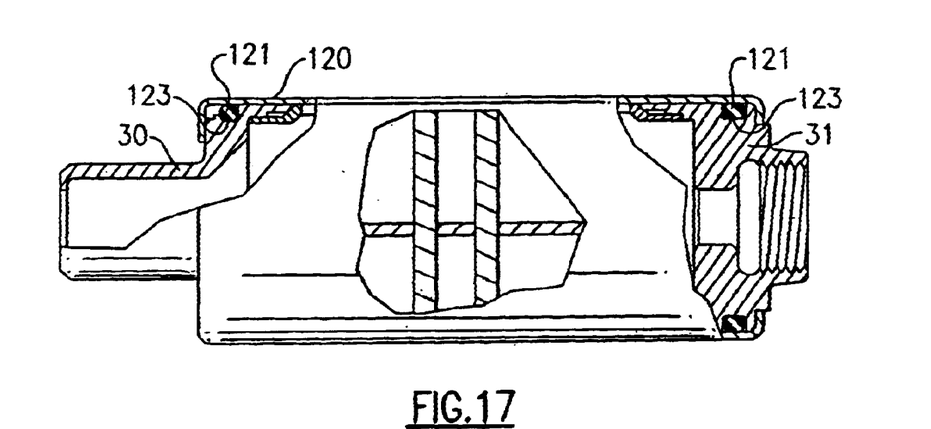
FIG. 17 shows an alternative embodiment of the filter shown in FIG. 9, including a protective outer tube and O-rings to provide a water-tight filter housing.

FIG. 17 shows that it is also possible to provide an outer protective tube 120 that is rolled over the assembled filter housing members and end caps, and compresses O-rings 121 positioned in grooves 123 formed on the outer peripheries of end caps 30 and 31. Use of this outer protective tube in combination with the sealing techniques described in Zennamo et al. U.S. Pat. No. 5,662,494 (the entirety of which is incorporated herein by reference) provide a filter that is completely sealed from the environment without the need for soldering during assembly of the filter components.

While the present invention has been particularly shown and described with reference to the preferred mode as illustrated in the drawings, it will be understood by one skilled in the art that various changes in detail may be effected therein without departing from the spirit and scope of the invention as defined by the claims.

We claim:

1. An electrical signal filter, comprising:

an elongate lower filter housing member extending along a first longitudinal direction from a first end thereof to an opposed second end thereof, and having an inner surface terminating at first and second upper side surfaces that extend from said first end to said second end, said elongate lower filter housing member further comprising a ground post formed integrally therewith and extending upwardly from said inner surface in a direction substantially perpendicular to said first longitudinal direction;

an elongate upper filter housing member extending along said first longitudinal direction from a first end thereof to an opposed second end thereof, and having an inner surface terminating at first and second lower side surfaces that extend from said first end to said second end, said elongate upper filter housing member abutting said elongate lower filter housing member at a junction between said first and second lower side surfaces and said first and second upper side surfaces, respectively, to thereby define an internal filter cavity; and a circuit board positioned within said filter cavity and having a ground terminal fastened to said ground post without the use of solder.

2. The electrical signal filter of claim 1, wherein said ground terminal is a plated through-hole passing through said circuit board and said ground post has a shoulder portion and a pin extending upwardly from said shoulder portion, wherein a lower surface of said circuit board abuts said shoulder portion and said pin extends within said through-hole in said circuit board.

3. The electrical signal filter of claim 2, wherein said pin extends above an upper surface of said circuit board and a tip portion thereof is deformed to provide mechanical and electrical contact with said plated through-hole.

4. The electrical signal filter of claim 3, wherein said pin has a recess formed therein to assist in mechanical deformation of said tip portion thereof.

5. The electrical signal filter of claim 2, further comprising at least one isolation shield positioned to divide said internal filter cavity into first and second filter cavities, said isolation shield having an abutment surface on which said circuit board rests, said abutment surface being at the same height as said shoulder portion.

6. The electrical signal filter of claim 1, wherein said ground post is cast as part of said lower filter housing member.

7. An electrical signal filter, comprising:

an elongate lower filter housing member extending along a first longitudinal direction from a first end thereof to an opposed second end thereof, and having an inner surface and an outer surface, said inner surface terminating at first and second upper side surfaces that extend from said first end to said second end, said elongate lower filter housing member further comprising a first mechanical engagement member extending circumferentially around portions of said outer surface proximate said first and second ends thereof;

an elongate upper filter housing member extending along said first longitudinal direction from a first end thereof to an opposed second end thereof, and having an inner surface and an outer surface, said inner surface terminating at first and second lower side surfaces that extend from said first end to said second end, said elongate upper filter housing member abutting said elongate lower filter housing member at a junction between said first and second lower side surfaces and said first and second upper side surfaces, respectively, to thereby define an internal filter cavity, said elongate upper filter housing member further comprising a first mechanical engagement member extending circumferentially around portions of said outer surface proximate said first and second ends thereof;

a one-piece circuit board positioned in said internal filter cavity; and end caps positioned on said first and second ends of the abutted upper and lower filter housing members, each of said end caps having a second mechanical engagement member formed on an inner surface thereof that is complementary to and mates with the first mechanical engagement members formed on said upper and lower filter housing members.

8. The electrical signal filter of claim 7, wherein said upper and lower filter housing members are secured to said end caps without solder.

9. The electrical signal filter of claim 7, wherein said first mechanical engagement member is one of a series of projected ribs and a series of grooves, said second mechanical engagement member is the other one of a series of projected ribs and a series of grooves.

10. The electrical signal filter of claim 7, further comprising an outer protective tube secured over said end caps and the abutted upper and lower filter housing members through interposed sealing members.

11. An electrical signal filter, comprising:

an elongate lower filter housing member extending along a first longitudinal direction from a first end thereof to an opposed second end thereof, and having an inner surface terminating at first and second upper side surfaces that extend from said first end to said second end;

a ground post formed integrally with said lower filter housing member and extending upwardly from said inner surface thereof in a direction substantially perpendicular to said first longitudinal direction;

a first mechanical engagement member extending circumferentially around portions of said outer surface of said lower filter housing member proximate said first and second ends thereof;

an elongate upper filter housing member extending along said first longitudinal direction from a first end thereof to an opposed second end thereof, and having an inner surface terminating at first and second lower side surfaces that extend from said first end to said second end, said elongate upper filter housing member abutting said elongate lower filter housing member at a junction between said first and second lower side surfaces and said first and second upper side surfaces, respectively, to thereby define an internal filter cavity;

a first mechanical engagement member extending circumferentially around portions of said outer surface of said upper filter housing member proximate said first and second ends thereof;

a circuit board positioned within said filter cavity and having a ground terminal fastened to said ground post without the use of solder; and end caps positioned on said first and second ends of the abutted upper and lower filter housing members, each of said end caps having a second mechanical engagement member formed on an inner surface thereof that is complementary to and mates with the first mechanical engagement members formed on said upper and lower filter housing members.

12. The electrical signal filter of claim 11, wherein said ground terminal is a plated through-hole passing through said circuit board and said ground post has a shoulder portion and a pin extending upwardly from said shoulder portion, wherein a lower surface of said circuit board abuts said shoulder portion and said pin extends within said through-hole in said circuit board.

13. The electrical signal filter of claim 12, wherein said pin extends above an upper surface of said circuit board and a tip portion thereof is deformed to provide mechanical and electrical contact with said plated through-hole.

14. The electrical signal filter of claim 13, wherein said pin has a recess formed therein to assist in mechanical deformation of said tip portion thereof.

15. The electrical signal filter of claim 12, further comprising at least one isolation shield positioned to divide said internal filter cavity into first and second filter cavities, said isolation shield having an abutment surface on which said circuit board rests, said abutment surface being at the same height as said shoulder portion.

16. The electrical signal filter of claim 11, wherein said ground post is cast as part of said lower filter housing member.

17. The electrical signal filter of claim 11, wherein said upper and lower filter housing members are secured to said end caps without solder.

18. The electrical signal filter of claim 11, wherein said first mechanical engagement member is one of a series of projected ribs and a series of grooves, and said second mechanical engagement member is the other one of a series of projected ribs and a series of grooves.

19. The electrical signal filter of claim 11, further comprising an outer protective tube secured over said end caps and the abutted upper and lower filter housing members through interposed sealing members.

* * * * *